United States Patent [19]

Hisaka

[11] Patent Number: 5,334,889
[45] Date of Patent: Aug. 2, 1994

[54] CMOS OUTPUT BUFFER CIRCUIT WITH LESS NOISE

[75] Inventor: Katsuhiro Hisaka, Tokyo, Japan

[73] Assignee: Oki Electric Industry, Co., Ltd., Tokyo, Japan

[21] Appl. No.: 834,545

[22] PCT Filed: Jun. 19, 1991

[86] PCT No.: PCT/JP91/00816
§ 371 Date: Feb. 12, 1992
§ 102(e) Date: Feb. 12, 1992

[87] PCT Pub. No.: WO91/20130
PCT Pub. Date: Dec. 26, 1991

[30] Foreign Application Priority Data
Jun. 20, 1990 [JP] Japan .................. 2-162194

[51] Int. Cl.[5] ............... H03K 19/092; H03K 17/16
[52] U.S. Cl. .......................... 307/475; 307/270; 307/443
[58] Field of Search ............... 307/443, 473, 475, 270, 307/451

[56] References Cited

U.S. PATENT DOCUMENTS
5,124,579 6/1992 Naghshineh .................. 307/443
5,194,764 3/1993 Yano et al. .................. 307/443

FOREIGN PATENT DOCUMENTS
60-62725  4/1985  Japan .
62-71325  4/1987  Japan .
64-86549  3/1989  Japan .
 2-4010   1/1990  Japan .
2-141023  5/1990  Japan .

*Primary Examiner*—Edward P. Westin
*Assistant Examiner*—Richard Roseen
*Attorney, Agent, or Firm*—Spencer, Frank & Schneider

[57] ABSTRACT

An output buffer circuit for use with a power source having first and second power source terminals includes an output terminal, a first transistor connected between the first power source terminal and the output terminal and a second transistor connected between the second power source terminal and the output terminal. A control signal which shifts gradually from the potential at the second power source terminal to the potential at the first power source terminal is applied to the gate of the second transistor. As a consequence, undesirable noises are well suppressed without any substantial degradation in high speed operation.

28 Claims, 3 Drawing Sheets

CMOS OUTPUT BUFFER CIRCUIT WITH LESS NOISE

BACKGROUND OF THE INVENTION

The present invention relates to an output buffer circuit, and more particularly relates to an output buffer circuit well adapted for use in a semiconductor integrated circuit to reduce noise.

It is generally required for an output buffer circuit incorporated in a semiconductor integrated circuit to be able to drive a load of a large capacity, which is connected to the output terminal of the circuit, at a high speed. High speed driving by an output buffer circuit of a high current drive capability, however, causes abrupt flow of a large current in the power source and earth lines at the moment of charge-up or discharge, thereby inducing undesirable noises in these lines. In particular in the case of a semiconductor integrated circuit, generation of such noises causes a serious problem since its input signal level and output voltage discrimination level are both close to the earth level.

It is proposed in Japanese Laid-open Patent No. 60-62725 to interpose a Miller capacitance between the input and output terminals of an output inverter circuit in an attempt to suppress generation of such undesirable noises.

The output buffer circuit of this earlier proposal is, however, quite unsuited for high speed operation since the Miller capacitance included therein slows the rise and fall of a signal wave form.

SUMMARY OF THE INVENTION

Thus, it is the primary object of the present invention to provide an output buffer circuit capable of suppressing generation of noises without degrading its high speed operation.

It is another object of the present invention to provide an output buffer circuit having a constant output response time regardless of changes in process conditions such as temperature, power source and variations in manufacture.

In accordance with one aspect of the present invention, an output buffer circuit comprises an output terminal; a first transistor connected between a first power source terminal and the output terminal for performing electric connection of the first power source terminal to the output terminal over a first prescribed period; a second transistor connected between a second power source terminal and the output terminal and having a control terminal which controls electric connection between the second power source terminal and the output terminal; control means connected to the control terminal of the second transistor for generating a first control signal with a first logic level during the first prescribed period and further generating the first control signal with a second logic level during a second prescribed period which follows the first prescribed period; delay means for receiving the first control signal and for generating, on receipt of the first control signal with the second logic level, a delay signal with the second logic level at a timing of a prescribed delay time after reception; and control signal supply means for supplying, on receipt of the first control signal and the delay signal, the second control signal to the control terminal in such a manner that, during the delay time after the first prescribed period, the level of the second control signal gradually shifts from the first towards the second logic level whereas, after receipt of the delay signal, the level of the second control signal relatively swiftly shifts to the second logic level.

In accordance with the second aspect of the present invention, an output buffer circuit comprises an output terminal; a first switch connected between a first power source terminal and the output terminal for performing electric connection of the first power source to the output terminal over a first prescribed period; a first field effect transistor (hereinafter described as an FET) having a first electrode connected to a second power source terminal, a second electrode connected to the output terminal, and a control electrode; a second FET provided with a first electrode connected to the second electrode of the first FET, a second electrode, and a control electrode; a capacitor connected between the second electrode of the second FET and the control electrode of the first FET; a first control means for generating a control signal to the control electrode of the first FET during a second prescribed period which follows the first prescribed period; and a second control means for applying a voltage related to the first power source to the control electrode of the second FET during the second prescribed period.

DESCRIPTION OF THE PREFERRED EMBODIMENTS

Figure 1:
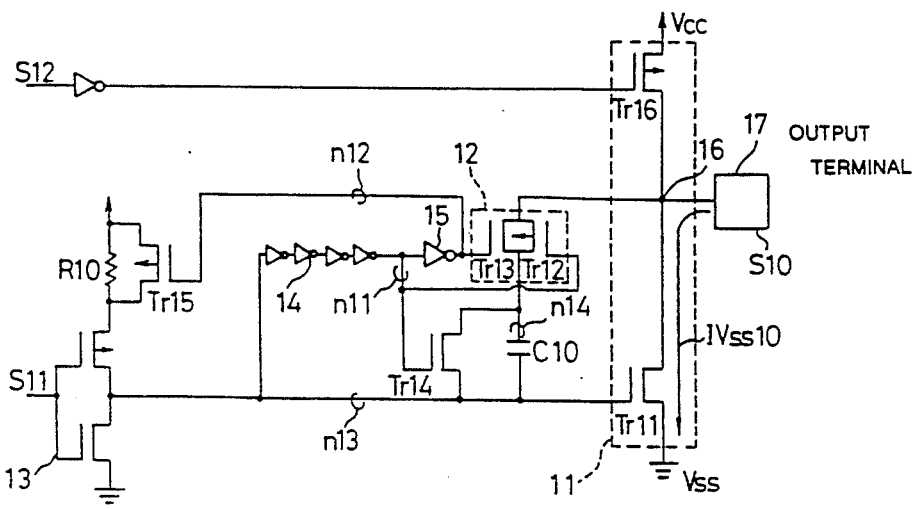
FIG. 1 is a circuit diagram of the first embodiment of the output buffer circuit in accordance with the present invention.
Figure 2:
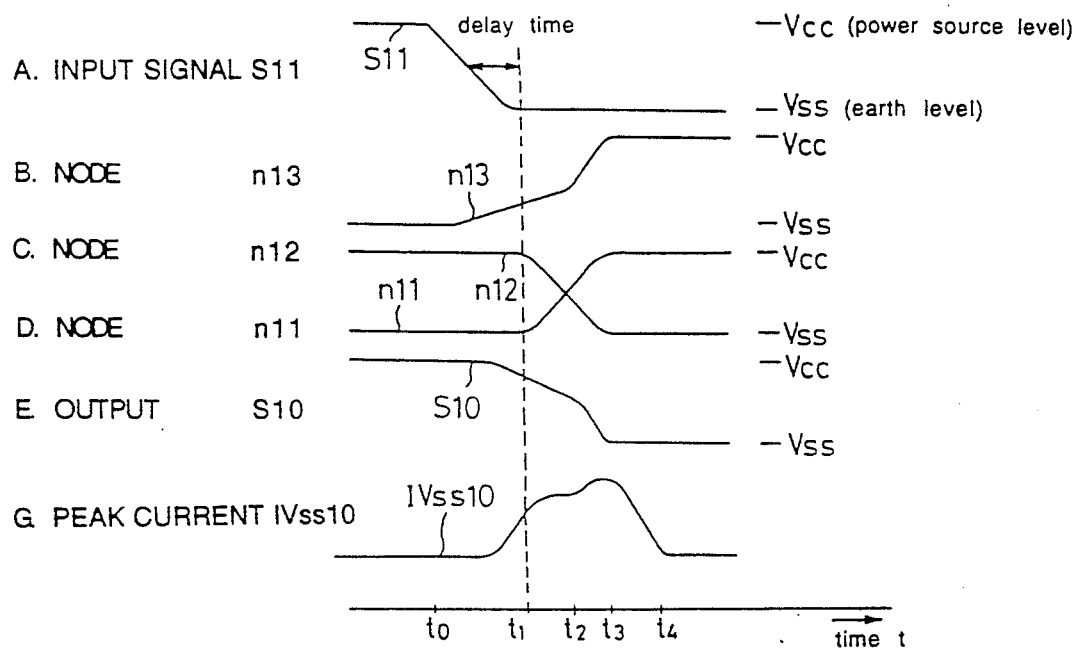
FIG. 2 is a timing diagram of various signal wave forms for explaining the operation of the circuit shown in FIG. 1.

The first embodiment of the output buffer circuit is shown in FIG. 1 and wave forms of signals processed therethrough are time-functionally shown in FIG. 2. A tri-state output circuit 11 shown in FIG. 1 outputs an output signal S10, via a node 16, to an output terminal 17, in response to output buffer signals S11 and S12. The output terminal 17 may provide a low level signal representing a logic "0", a high level signal representing a logic "1" or a high impedance state. The tri-state output circuit includes P-channel type transistor (hereinafter described as PMOS) Tr16 and an N-channel type transistor (hereinafter described as NMOS) Tr11, connected in series with both drains being commonly connected to each other between a power source voltage Vcc and an earth voltage Vss via the intervening node 16. The NMOS Tr11 is used for output load capacity discharge. A switch circuit 12 and a capacitor C10 are connected in series between the gate of the NMOS Tr11 of the tri-state output circuit 11 and the node 16.

The switch circuit 12 is constituted by a pair of transistors Tr12 and Tr13 connected in parallel and an inverter circuit 13 performs on-off control of these transistors Tr12 and tr13. A delay circuit 14 is connected between the switch circuit 12 and the inverter circuit 13. In the case of this embodiment, the delay circuit 14 is constituted by inverters connected in series with a four-stage arrangement. A PMOS is used for the transistor Tr12 and an NMOS for the transistor Tr13. The transistor Tr12 is controlled by an output signal node n11 of the delay circuit 14 whereas the transistor Tr13 is controlled by a signal node n12 which obtained through inversion of the output signal of the delay circuit 14 by an inverter circuit 15. A fourth transistor Tr14 is connected in parallel to the capacitor C10, which is same in polarity as the third transistor Tr13. This transistor Tr14 is controlled by the output signal node n11 of the delay circuit 14. A resistor R10 is provided between the power source and the inverter circuit 13. A MOS transistor Tr15 is connected in parallel to the resistor R10, which is different in polarity from the third transistor Tr13. As well as the case of the third transistor Tr13, the node n12 is involved in on-off control of the fifth transistor Tr15.

As the level of the input signal S11, which is applied to the input electrode of the inverter circuit 13, shifts from a high to low level in the output buffer circuit of the above-described construction at a moment t0 as shown in (A) of FIG. 2, an output node n13 of the inverter circuit 13 rises from the earth to the power source level as shown in (B) of FIG. 2. Since the fourth and fifth transistors Tr14, Tr15 are both in an off-state at this moment, the rising time of the node 13 takes an integrated form due to operation of the resistor R10 and the capacitor C10 and the voltage of the node n13 rises gradually as illustrated in (B) of FIG. 2.

At a moment t1 after passage of the delay time determined by the delay circuit 14, the level of the node n12 falls from a high to low level as shown in (C) and (D) of FIG. 2. Concurrently with this process, the level of the node n11 rises from the low to high state. As a result, the switch circuit 12 turns off to disconnect the capacitor C10 from the output circuit. Concurrently with this, the transistors Tr14 and Tr15 respectively turn on so that short circuits are established across resistor R10 and capacitor C10.

The Miller integration effect caused by the resistor R10 and the capacitor C10 is now canceled and, as shown in (E) of FIG. 2, the output signal 10 is rapidly discharged after a moment t2. That is, discharge of the output load capacity is carried out slowly only during the delay time determined by the delay circuit 14 and rapidly after the output voltage has fallen to the level of an intermediate voltage in the case of the output buffer circuit of the first embodiment. As a result, a peak current I Vss10 from the transistor Tr11 of the tri-state output circuit 11 can be well dissipated to reliably suppress generation of noises in the earth line with minimum degradation in high speed operation.

In the case of this embodiment, the fourth transistor Tr14 is used for establishment of the short circuit for the capacitor C10 when the switch circuit 12 becomes off-state. Establishment of such a short circuit prevents the node n14 from exceeding the gate level of the second transistor Tr12, thereby enabling construction of the switch circuit 12 by use of MOS transistors such as the transistors Tr12 and Tr13.

The foregoing description is focussed on application to the earth side transistors but is similarly applicable to the case of the power source side transistors too.

In accordance with the first embodiment of the present invention, a series circuit, which is constituted by a capacitance component and a switch circuit, is provided between input and output terminals of a discharge transistor arranged in an output stage circuit and a delay circuit is provided for driving the switch circuit for operation after passage of a prescribed time. The switch circuit achieves an off-state, after passage of a prescribed time since initiation of an integrating operation, to disconnect the capacitance component from the discharge transistor. Consequently, gradient in change of current is minimized through the integrating function when the output is at a high level and current consumption is large, whereas the load capacitor is swiftly discharged after the output has fallen to an intermediate level. Generation of unnecessary radiation waves and harsh noises is effectively suppressed without any degradation in high speed operation. Thus, employment of the present invention enables production of an integrated circuit without any substantial degradation in its high speed operation. It is suited for use in circumstances where generation of unnecessary electromagnetic radiation should be avoided as well as in electronic devices of high density.

Figure 3:
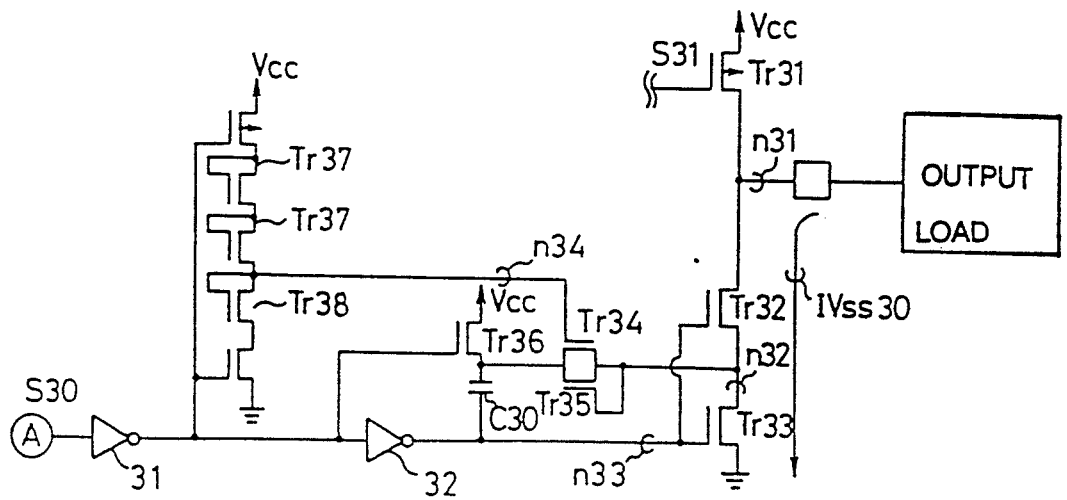
FIG. 3 is a circuit diagram of the second embodiment of the output buffer circuit in accordance with the present invention.

The second embodiment of the output buffer circuit in accordance with the present invention is shown in FIG. 3, in which an input terminal A of an inverter 31 receives an output buffer control signal S30. The output from the inverter 31 is passed to a subsequent inverter 32, whose output node n33 in connected to the gates of transistors Tr32 and Tr33. That is, the output from the inverter 32 drives these transistors Tr32 and Tr33 for discharging operation. A chargeup transistor 31 is controlled by an output buffer control signal S31. A pair of NMOS transistors Tr34 and Tr35 are connected in parallel to each other and this transistor pair is connected in series to a capacitance component C30 between two nodes n32 and n33. The gate of the transistor T34 receives an inverted signal from the inverter 31, the signal having the power source level minus nVt. (In the illustrated example, Vcc−2Vt; n indicates the number of load MOS transistors Tr37 and Vt indicates the threshold value of the transistors Tr37). The gate of the transistor Tr35 is connected to the node n32 to form a forward direction diode from the node n32. An NMOS transistor Tr36 is connected between the power source line Vcc and the capacitance component C30, and the gate of transistor Tr36 receives the output from the inverter 31.

Figure 4:
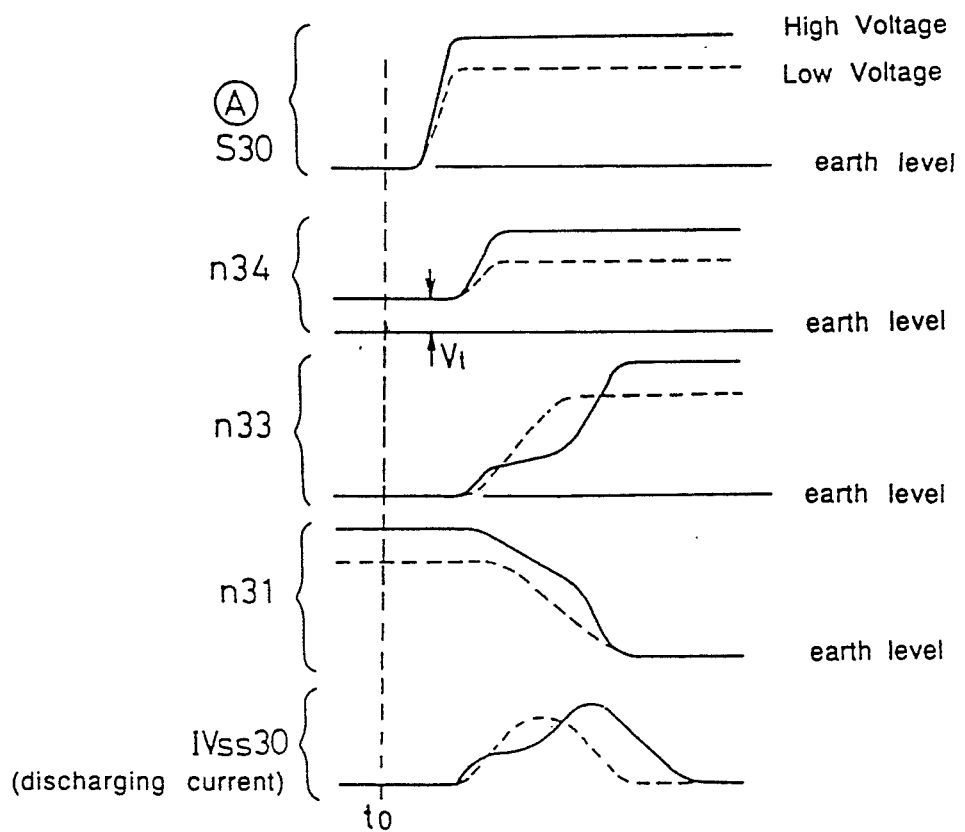
FIG. 4 is a timing diagram of various signal wave forms for explaining the operation of the circuit shown in FIG. 3.

As illustrated in FIG. 4, the input terminal A receives a signal S30 having a low level at a moment t0. In this case, the node n33 is at a low level and the output discharge transistors Tr32 and Tr33 are in an off-state, thereby allowing no flow of IVss30. At this moment, the node n32 is in a floating state and its level varies between −Vt and ∞. Consequently, the transistor Tr35 suppresses a rise in voltage. When the level at the node n34 is set to the threshold value of a load MOS transistor Tr38, the node n32 does not fall to a negative voltage. The transistor Tr36 is kept in an on-state at the moment t0 so that the capacitance component C30 is charged.

When the input terminal A receives a signal S30 having a high level, the node n34 rises from Vt to Vcc−2Vt, the transistor Tr34 is turned on, and the transistor Tr36 is turned off. The transistors Tr32 and Tr33 are turned on thereby allowing flow of IVss30. The rise time of the node n33 takes a value integrated by operation of the capacitance component 30 and an ON resistance RTr34 of the transistor Tr34. As shown with a solid line in FIG. 4, the resistance RTr34 takes a low value when the power source voltage Vcc is at a high level, e.g. at 5.5 V. This low value of the resistance RTr34 enlarges the Miller integration effect in accordance with the capacitance component C30. When the power source voltage Vcc is at a low level such as 4.5 V, the resistance RTr34 changes to take a high value to reduce the Miller integration effect. Thus, high speed operation is not degraded in the case of low level supply voltages, where malign influence by noises can be endured relatively well, whereas the peak current IVss30 is dissipated only in the case of high level supply voltages and associated vulnerability to noise, thereby enabling effective capture of harmful noises.

When the transistor threshold value Vt varies as a result of variations manufacture, a high level of the value Vt makes the potential at node n34 substantially lower than the power source voltage and, as a result, the transistor resistance RTr34 is enlarged. This reduces the Miller effect and causes no substantial delay in output response time. On the contrary, a low level of the value Vt enlarges the Miller effect and, as a consequence, excessively high speed switching is suppressed.

Similar effects can be expected against temperature-dependent changes in the output response time. Lowering of the current drive capacity gm of the transistor Tr34 caused by high temperature reduces the Miller effect, thereby maintaining the high speed operation. A rise in the current drive capacity gm due to a fall in temperature increases the Miller effect, thereby suppressing excessively high speed switching.

In accordance with the second embodiment of the present invention, the Miller effect in effectively utilized only when the peak current is enlarged due to high voltage, low temperature and/or low threshold value. The Miller effect is limited under other conditions to suppress generation of undesirable noises without any degradation in high speed operation.

By employment of the two-stage arrangement of the discharge transistors Tr32 and Tr33 as shown in FIG. 3, malign influence by the output load is minimized for efficient utilization of the Miller effect.

Figure 5:
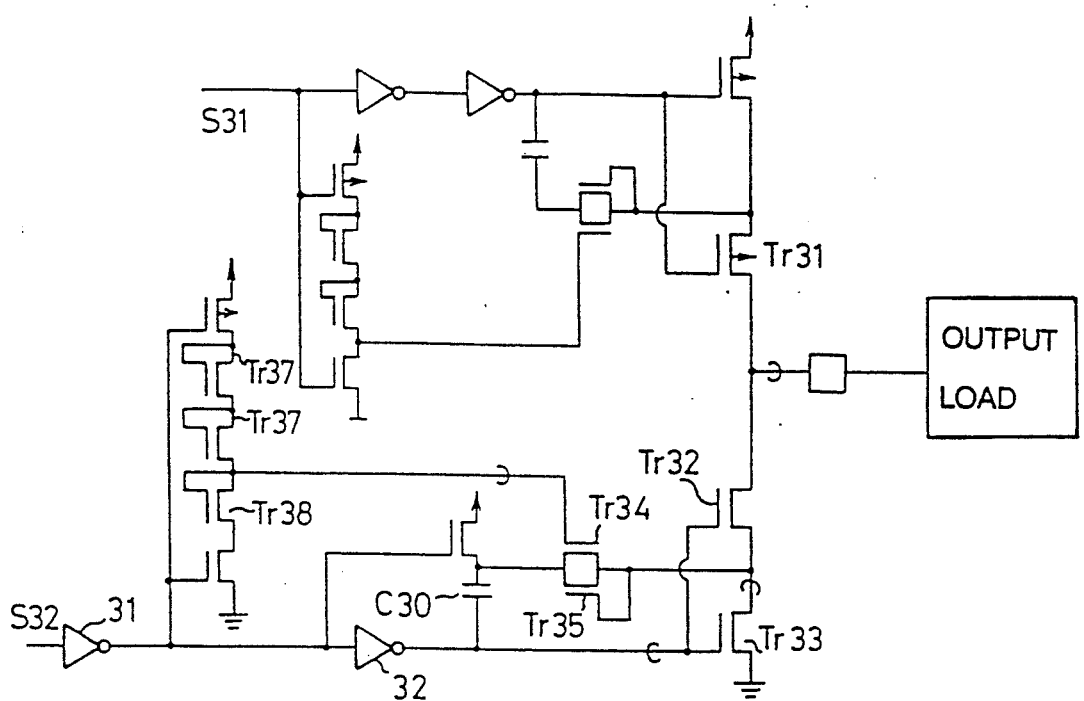
FIG. 5 is a circuit diagram of a variation of the second embodiment shown in FIG. 3.

Although the description has been focussed on the earth side transistors Tr32 and Tr33 of the circuit, as shown in FIG. 5, the present invention is similarly applicable to power source side transistor Tr31, too.

As is clear from the foregoing descriptions, the present invention provides an output buffer circuit which well suppresses generation of noises without any substantial degradation in high speed operation.

I claim:

1. An output buffer for use with a power source having first and second power source terminals, comprising:

an output terminal;

a first field effect transistor coupled between said first power source terminal and said output terminal for electrically connecting said first power source terminal with said output terminal, in a first prescribed period;

a second field effect transistor coupled between said second power source terminal and said output terminal, and having a control terminal for electrically connecting said second power source terminal with said output terminal;

an inverter circuit coupled between said first and second power source terminals for generating a first control signal having a first logic level during said first prescribed period and a second logic level in a second prescribed period following said first prescribed period, said inverter having an output terminal coupled to said control terminal of said second field effect transistor via a first node;

a delay circuit for receiving said first control signal and for generating a delay signal having said second logic level at a prescribed delay time after said first control signal having said second logic level is received thereby; and a control signal supply circuit, receiving said first control signal and said delay signal, for applying a second control signal to said control terminal of said second field effect transistor, said control signal supply circuit including a capacitor having a first terminal connected to said first node and a second terminal, a first switch which is coupled between said second terminal of said capacitor and said output terminal and which is turned to a non-conductive state in response to said delay signal having said second logic level, a second switch which is coupled between said second terminal of said capacitor and said first node and which is turned to a conductive state in response to said delay signal having said second logic level, a resistor which is coupled between said first power source terminal and said inverter circuit, and a third switch which is coupled in parallel to said resistor and which is turned to a conductive state in response to said delay signal having said second logic level, whereby during said prescribed delay time after said first prescribed period, said second control signal is gradually changed from said first logic level towards said second logic level, and after receipt of said delay signal, said second control signal is relatively swiftly changed to said second logic level.

2. An output buffer circuit for use with a power source having first and second power source terminals, comprising:

an output terminal;

a first switch coupled between said first power source terminal and said output terminal for electrically connecting said first power source terminal and said output terminal in a first prescribed period;

a first field effect transistor having a first electrode coupled to said second power source terminal, a second electrode coupled to said output terminal, and a control electrode;

a second field effect transistor having a first electrode coupled to said second electrode of said first field effect transistor, a second electrode, and a control electrode;

a third field effect transistor having a first electrode coupled to said output terminal, a second electrode coupled to said second electrode of said second field effect transistor, and a control electrode;

a capacitor coupled between said second electrode of said second field effect transistor and said control electrode of said first field effect transistor;

a first control circuit for providing a control signal to said control electrodes of said first and third field effect transistors during a second prescribed period following said first prescribed period; and a second control circuit for applying a voltage related to a potential at said first power source terminal to said control electrode of said second field effect transistor.

3. An output buffer circuit as forth in claim 2, further comprising a fourth field effect transistor coupled in parallel to said second field effect transistor, said fourth field effect transistor having a control electrode which is coupled to said second electrode of said first field effect transistor.

4. An output buffer circuit as set forth in claim 3, further comprising a fifth field effect transistor coupled between said second electrode of said second field effect transistor and said first power source terminal, said fifth field effect transistor being in an off-state during said second prescribed period.

5. An output buffer circuit as set forth in claim 4, wherein said fifth field effect transistor is in an on-state during said first prescribed period.

6. An output buffer circuit as set forth in claim 2, wherein said second control circuit includes a sixth field effect transistor coupled to said first power source terminal, and a resistance circuit coupled between said sixth field effect transistor and said control electrode of said second field effect transistor, said sixth field effect transistor being in an on-state during said second prescribed period.

7. An output buffer circuit as set forth in claim 6, wherein said sixth field effect transistor is in an off-state during said first prescribed period.

8. An output buffer circuit for outputting an output signal from an output terminal thereof, the output buffer circuit comprising:
- a first switch coupled between a first potential terminal and the output terminal, the first switch having a first control terminal;
- a second switch coupled between a second potential terminal and the output terminal, the second switch having a second control terminal;
- an input terminal which receives an input signal;
- an input circuit, coupled to the input terminal and the second control terminal, for outputting a control signal to the second switch in response to the input signal, the input circuit including a third switch coupled between the first potential terminal and the second control terminal, and a fourth switch coupled between the second potential terminal and the second control terminal;
- a delay circuit, coupled to the input circuit, for generating a delay signal in response to the control signal; and
- an integration circuit, coupled to the input circuit and the delay circuit, for causing a change in the level of the control signal to occur gradually, the integration circuit being deactivated in response to a change in the delay signal, the integration circuit including
  - a resistance circuit coupled between the third switch and the first potential terminal,
  - a fifth switch coupled in parallel to the resistance circuit, the fifth switch having a control terminal coupled to the delay circuit,
  - a capacitor having a first terminal coupled to the second control terminal, the capacitor additionally having a second terminal,
  - a sixth switch coupled in parallel to the capacitor, the sixth switch having a control terminal coupled to the delay circuit, and
  - a seventh switch coupled between the output terminal and the second terminal of the capacitor, the seventh switch having a control terminal coupled to the delay circuit.

9. An output buffer circuit according to claim 8, wherein the delay circuit includes a plurality of inverters connected in series.

10. An output buffer circuit according to claim 8, wherein the seventh switch comprises a transfer gate circuit.

11. An output buffer circuit according to claim 8, wherein the first control terminal receives a signal which is a complement of the input signal.

12. An output buffer circuit for outputting an output signal from an output terminal thereof, the output buffer circuit comprising:
- a first switching circuit having a first electrode coupled to a first potential terminal, a second electrode coupled to the output terminal, and a control terminal, the first switching circuit including a first transistor of a first conductivity type;
- a second switching circuit having a first electrode coupled to a second potential terminal, a second electrode coupled to the output terminal, and a control terminal, the second switching circuit including a second transistor of a second conductive type and a third transistor of the second conductive type, each of the second and third transistors having a first electrode, a second electrode, and a control electrode, the first electrode of the second transistor being coupled to the output terminal and serving as the second electrode of the second switching circuit, the second electrode of the third transistor being coupled to the second potential terminal and serving as the first electrode of the second switching circuit, the control electrodes of the second and third transistors being coupled together to serve as the control electrode of the second switching circuit, and the second electrode of the second transistor being coupled to the first electrode of the third transistor at a first node;
- a first input terminal which receives an input signal;
- a first control circuit, coupled to the first input terminal and the control terminal of the second switching circuit, for outputting a first control signal to the control terminal of the second switching circuit in response to the input signal; and
- a first integration circuit, coupled to the first control circuit, for gradually changing the level of the first control signal in response to a change in the input signal.

13. An output buffer circuit according to claim 12, wherein the first integration circuit includes a first capacitor and a first resistance circuit.

14. An output buffer circuit according to claim 13, wherein the first capacitor has a first terminal coupled to the control terminal of the second switching circuit and a second terminal, and the first resistance circuit is coupled between the first node and the second terminal of the first capacitor.

15. An output buffer circuit according to claim 14, wherein the first resistance circuit has a control input terminal, wherein the first integration circuit further includes a second control circuit, coupled to the control input terminal of the first resistance circuit, for outputting a second control signal to the first resistance circuit in response to the input signal, and wherein the first resistance circuit works as a resistor when the second control signal is received by the first resistance circuit.

16. An output buffer circuit according to claim 15, wherein the first integration circuit further includes a fourth transistor of the second conductive type having a first electrode coupled to the first potential terminal, a second electrode coupled to the second terminal of the first capacitor, and a control electrode coupled to the first control circuit.

17. An output buffer circuit according to claim 16, wherein the second control circuit includes:
a fifth transistor of a first conductive type having a first electrode coupled to the first potential terminal, a second electrode, and a control electrode coupled to the first control circuit;
means for coupling the second electrode of the fifth transistor to the control input terminal of the first resistance circuit;
a sixth transistor of the second conductive type having a first electrode, a second electrode coupled to the control input terminal of the first resistance circuit, and a control electrode coupled to the second electrode of the sixth transistor; and
a seventh transistor of the second conductive type having a first electrode coupled to the second potential terminal, a second electrode coupled to the first electrode of the sixth transistor, and a control electrode coupled to the first control circuit.

18. An output buffer circuit according to claim 14, wherein the first resistance circuit includes an eighth transistor of the second conductive type having a first electrode coupled to the second terminal of the first capacitor, a second electrode coupled to the first node, and a control electrode serving as the control input terminal of the first resistance circuit.

19. An output buffer circuit according to claim 18, wherein the first resistance circuit further includes a ninth transistor of the second conductive type having a first electrode coupled to the second terminal of the first capacitor, a second electrode, and a control electrode, the second electrode and the control electrode of the ninth transistor being coupled to the first node together.

20. An output buffer circuit according to claim 12, wherein the first control circuit comprises an inverter.

21. An output buffer circuit for outputting an output signal from an output terminal thereof, the output buffer circuit comprising:
a first switching circuit having a first electrode coupled to a first potential terminal, a second electrode coupled to the output terminal, and a control terminal, the first switching circuit including a first transistor of a first conductive type and a second transistor of the first conductive type, each of the first and second transistors having a first electrode, a second electrode, and a control electrode, the first electrode of the first transistor being coupled to the first potential terminal and serving as the first electrode of the first switching circuit, the second electrode of the second transistor being coupled to the output terminal and serving as the second electrode of the first switching circuit, the control electrodes of the first and second transistors being coupled together to serve as the control electrode of the first switching circuit, and the second electrode of the first transistor being coupled to the first electrode of the first transistor at a first node;
a second switching circuit having a first electrode coupled to a second potential terminal, a second electrode coupled to the output terminal, and a control terminal;
a first input terminal which receives an input signal;
a first control circuit, coupled to the first input terminal and the control terminal of the second switching circuit, for outputting a first control signal to the control terminal of the second switching circuit in response to the input signal;
a first integration circuit coupled to the first control circuit for gradually changing the level of the first control signal in response to a change in the input signal;
a second input terminal which receives a complement signal of the input signal;
a second control circuit, coupled to the control terminal of the first switching circuit and the second input terminal, for outputting a second control signal to the control terminal of the first switching circuit in response to the complement signal; and
a second integration circuit, coupled to the second control circuit, for gradually changing the level of the second control signal in response to a change in the complement signal.

22. An output buffer circuit according to claim 21, wherein the second integration circuit includes a first capacitor and a first resistance circuit.

23. An output buffer circuit according to claim 22, wherein the first capacitor has a first terminal coupled to the control terminal of the first switching circuit and a second terminal, and the first resistance circuit is coupled between the first node and the second terminal of the first capacitor.

24. An output buffer circuit according to claim 25, wherein the first resistance circuit has a control input terminal, wherein the second integration circuit further includes a third control circuit, coupled to the control input terminal of the first resistance circuit, for outputting a third control signal to the first resistance circuit in response to the complement signal, and wherein the first resistance circuit works as a resistor when the third control signal is received by the first resistance circuit.

25. An output buffer circuit according to claim 24, wherein the third control circuit includes:
a third transistor of the first conductive type having a first electrode coupled to the first potential terminal, a second electrode, and a control electrode coupled to the second control circuit;
a coupling circuit for coupling the second electrode of the third transistor to the control input terminal of the first resistance circuit;
a fourth transistor of the second conductive type having a first electrode, a second electrode coupled to the control input terminal of the first resistance circuit, and a control electrode; and
a fifth transistor of the second conductive type having a first electrode coupled to the second potential terminal, a second electrode coupled to the first electrode of the fourth transistor, and a control electrode coupled to the second control circuit.

26. An output buffer circuit according to claim 24, wherein the first resistance circuit includes a sixth transistor of the second conductive type having a first electrode coupled to the second terminal of the first capacitor, a second electrode coupled to the first node, and a control electrode serving as the control input terminal of the first resistance circuit.

27. An output buffer circuit according to claim 26, wherein the first resistance circuit further includes a seventh transistor of the second conductive type having a first electrode coupled to the first terminal of the second capacitor, a second electrode, and a control electrode, the second electrode and the control electrode of the seventh transistor being coupled to the first node together.

28. An output buffer circuit according to claim 21, wherein the second control circuit comprises an inverter.

* * * * *